United States Patent [19]

Chaudhuri

[11] 4,451,969
[45] Jun. 5, 1984

[54] METHOD OF FABRICATING SOLAR CELLS

[75] Inventor: Arup R. Chaudhuri, West Concord, Mass.

[73] Assignee: Mobil Solar Energy Corporation, Waltham, Mass.

[21] Appl. No.: 456,621

[22] Filed: Jan. 10, 1983

[51] Int. Cl.³ .............................................. H01L 31/18
[52] U.S. Cl. ...................................... 29/572; 136/256; 427/74; 427/88; 427/94; 148/189
[58] Field of Search ................... 29/572; 136/256, 261; 156/628, 657, 662; 427/35, 39, 51, 74, 75, 94, 88; 148/1.5, 186, 189; 204/164

[56] References Cited

U.S. PATENT DOCUMENTS

| | | | |
|---|---|---|---|
| 3,549,411 | 12/1970 | Bean et al. | 427/94 |
| 4,158,717 | 6/1979 | Nelson | 428/446 |
| 4,200,666 | 4/1980 | Reinberg | 427/39 |
| 4,266,985 | 5/1981 | Ito et al. | 148/1.5 |
| 4,268,711 | 5/1981 | Gurev | 136/256 |
| 4,321,283 | 3/1982 | Patel et al. | 427/74 |
| 4,347,262 | 8/1982 | Marcus | 427/74 |
| 4,347,264 | 8/1982 | Lindmayer | 430/314 |
| 4,359,487 | 11/1982 | Schneider | 427/75 |

OTHER PUBLICATIONS

F. W. Sexton, "Plasma Nitride AR Coatings for Silicon Solar Cells", *Solar Energy Mat'ls*, vol. 7, pp. 1–14 (1982).

M. J. Rand et al., "Optical Absorption as a Control Test for Plasma Silicon Nitride Deposition", *J. Electrochem. Soc.*, vol. 125, pp. 99–101 (1978).

W. A. Lanford et al., "The Hydrogen Content of Plasma-Deposited Silicon Nitride", *J. Appl. Phys.*, vol. 49, pp. 2473–2477 (1978).

M. G. Coleman et al., "Phase 2 of the Automated Array Assembly Task of the Low Cost Silicon Solar Array Project", pp. i–iv, 10–15, 37, 202–204, DOE/JP1/9548-47-4, Nov. 1978.

*Primary Examiner*—Aaron Weisstuch
*Attorney, Agent, or Firm*—Schiller & Pandiscio

[57] ABSTRACT

A solar cell fabrication procedure is described which is characterized by (1) formation of a "polysilazane" coating on a silicon substrate, (2) photo-lithography of the polysilazane coating to form a plating mask pattern, (3) a heating step which removes residual photoresist and converts the polysilazane coating to a denser form of silicon nitride having a reduced etch rate, and (4) use of densified silicon nitride as a mask for the plating of electrode metal and also as an anti-reflection coating.

23 Claims, 1 Drawing Figure

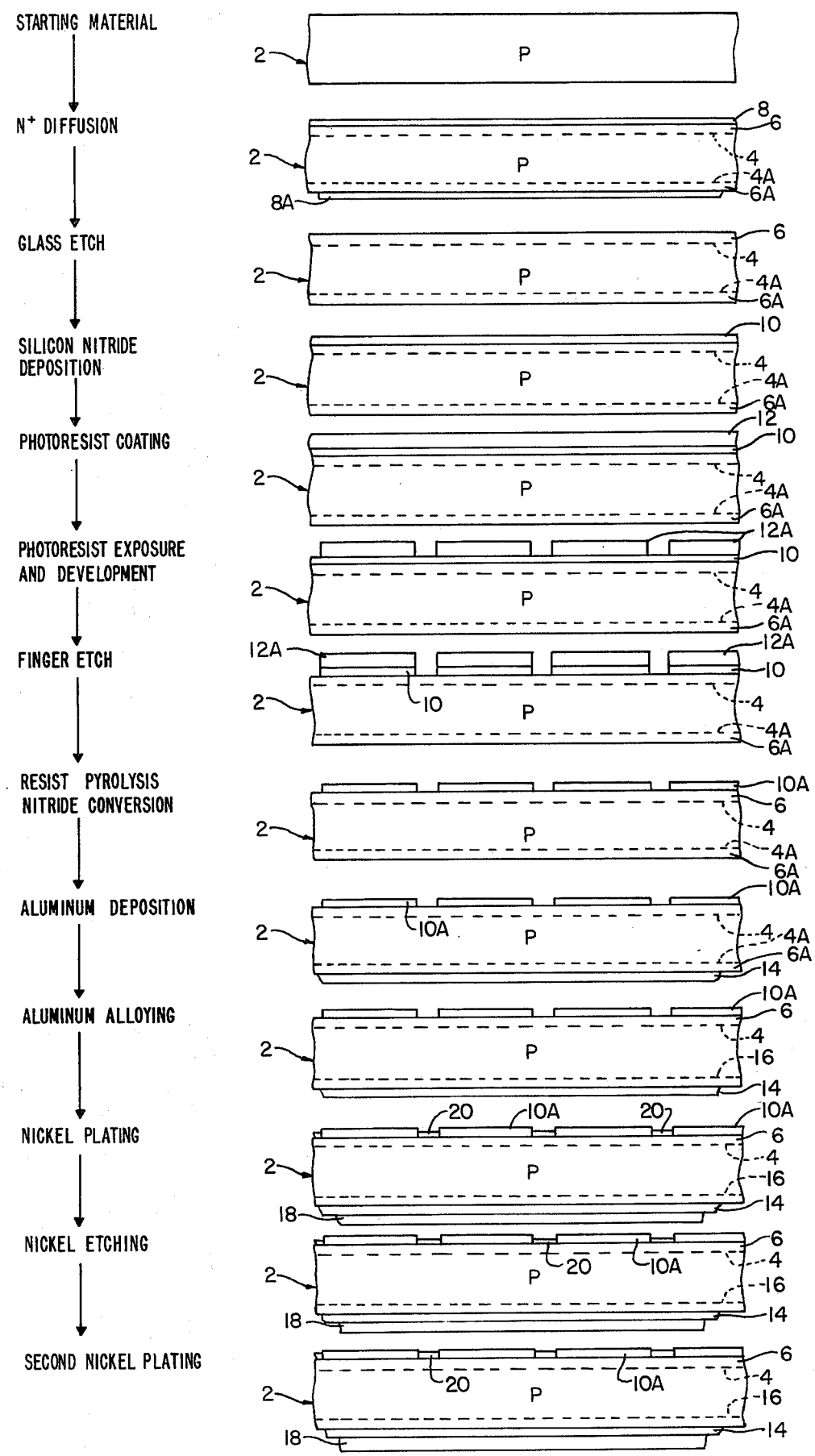

METHOD OF FABRICATING SOLAR CELLS

This invention pertains to the manufacture of photovoltaic cells and more particularly to an improved low cost method of fabricating silicon solar cells permitting the combination of plated nickel metallization with a shallow junction formed by phosphine diffusion.

PRIOR ART

Heretofore a common method of fabricating silicon solar cells has included the steps of forming a PN junction by diffusing a suitable dopant into the front side of a silicon wafer or ribbon, etching an ohmic grid electrode pattern in a protective dielectric masking layer formed on that front surface, depositing a nickel plating on all silicon exposed by the etching, overplating the nickel with copper and tin, removing the remainder of the dielectric masking layer from the front surface, and providing an antireflection coating on the newly exposed portions of the front surface. In prior methods the dielectric masking layer has been usually an oxide of silicon and the nickel and copper plating has been accomplished by electroless and electroplating techniques respectively. Electroless deposition of the nickekl has commonly been followed by heating the silicon wafer at a temperature of about 250° C. for the purpose of forming nickel silicide at the nickel/silicon interface in order for the nickel to make an adherent ohmic contact. The nickel acts as a diffusion barrier to the electroplated copper conductor layer. In prior methods involving nickel metallization, the junction typically was formed to a depth of about 5 microns. Cells made with shallower junctions, e.g., junctions about 3500 Angstrom units deep, were thought to be unsatisfactory due to increases in reverse leakage current caused by nickel diffusion during sintering. The problem of increased reverse leakage current may be alleviated by forming the junctions so that they are deeper in the regions immediately below the nickel metallization. However, forming a stepped junction requires either simultaneous diffusion from a gaseous atmosphere and a doped SiO$_2$ source as taught by U.S. Pat. No. 4,152,824 or at least two diffusions conducted in sequence. Either mode of forming a stepped junction increases costs. Also, forming a stepped junction from a doped SiO$_2$ source tends to result in deterioration of lifetime dependent parameters (Voc and Jsc) and a consequent reduction in diffusion lengths and solar cell efficiency. This deterioration tends to increase with the surface area of the silicon wafer and has been observed in cells made from single crystal Czochralski (CZ) grown silicon as well as in cells made from EFG grown silicon (the latter type of silicon tends to have substantially more crystallographic defects than CZ material).

At the time this invention was conceived, it was widely recognized that widespread use of photovoltaic solar cells was dependent upon the development of fabrication techniques capable of producing reliable solar cells with a conversion efficiency of 10% or higher at a relatively low cost. The cost of solar cells, like other semiconductor devices, depends on the cost of the starting materials and the cost of converting the starting materials into the finished product. The conversion of silicon into at least 10% efficient silicon solar cells at low cost cannot be accomplished without a suitable high performance junction formation technique and a low-cost metallization technique.

OBJECTS AND SUMMARY OF THE INVENTION

The primary object of this invention is to provide a low cost method of making semiconductor devices in which a silicon nitride coating is used to serve as a plating mask for selective electrode plating.

Another important object is to provide an improved low cost method of making photovoltaic semiconductor junction devices in which a selected dielectric material serves both as a mask to permit selective grid plating on the cell and also as an antireflection coating.

Still another important object is to provide a method of making semiconductor solar cells in which a layer of silicon nitride serves as a mask for metallization and also as an anti-reflection coating.

Still another important object is to provide an improved low cost method of making solar cells from EFG silicon which permits obtaining conversion efficiencies in the range of at least 10–12% on a routine basis.

A more specific object of this invention is to provide an improved method of fabricating silicon solar cells having a relatively shallow junction (about 3500 Angstrom units deep), using one-step diffusion from a vapor phase source to form a diode junction and nickel metallization to form an ohmic grid contact, whereby diffusion may be achieved without any perceptible increase in reverse leakage current over cells with nickel metallization having junctions of greater depth (about 5 microns or greater).

Another object of this invention is to provide an improved method of making silicon solar cells which is less expensive and more reliable than prior methods of like purpose employing nickel metallization to form ohmic contacts.

A further object of this invention is to provide a solar cell fabrication procedure of the character described which employs (1) a coating of an inorganic compound of silicon and nitrogen as a metallization plating mask and an antireflective coating, (2) photolithography for the formation of grid electrode patterns, and (3) controlled heating to rapidly and efficiently accomplish various functions including (a) removal of residual photoresist, and (b) conversion of the silicon and nitrogen-containing material to a substance with a substantially reduced etch rate.

The foregoing objects are achieved by a process which, in its preferred embodiment as applied to the manufacture of silicon solar cells, involves, inter alia, the following steps: (1) diffusing phosphine into P-type silicon ribbon so as to form a shallow junction, (2) forming on the junction side of the ribbon a thin coating of a polysilazane (a form of silicon nitride having a relatively high etch rate), (3) forming a grid electrode pattern in the polysilazane coating by photolithography (using a suitable photoresist composition and etching), (4) thermally treating the silicon so as to pyrolyze residual resist and convert the polysilazane coating to a form of silicon nitride having a lower etch rate, (5) coating the other side of the silicon ribbon with an aluminum paste, (6) heating the silicon so as to alloy the aluminum and silicon, (7) plating exposed silicon on both sides of the ribbon with nickel, (8) sintering the nickel to form a nickel silicide, and (9) plating additional metal(s) onto the metal covered portions of the silicon. Thereafter, the silicon may be further processed, e.g., to prepare it for connection to electrical circuits.

The initial silicon nitride (polysilazane) coating is formed by plasma deposition and has three key characteristics. First of all, in the as-deposited condition the silicon nitride has a relatively low density and has an etch rate which is adequately rapid to enable convenient etching of the grid pattern. Second, the thin silicon nitride layer does not crack during the thermal treatment and the alloying of aluminum and silicon. Third, as a result of the thermal treatment, the etch rate of the silicon nitride decreases sufficiently so that it can serve as a mask to enable selective grid plating without degrading cell performance.

BRIEF DESCRIPTION OF THE DRAWINGS

Other features and advantages of the invention are described or rendered obvious by the following detailed description which is to be considered together with the accompanying drawing which illustrates a number of the steps involved in making solar cells according to a preferred form of the invention. In the drawings, the thicknesses and depths of the several coatings and regions are not shown exactly in accordance with their relative proportions, for convenience of illustration.

DETAILED DESCRIPTION OF THE INVENTION

In the creation of this invention it has been discovered that it is possible to combine the advantage of a high performance junction formation technique with a low cost metallization technique if a dielectric layer is provided which (a) can be easily and precisely etched away in the form of a selected metallization pattern without any significant etching of silicon, (b) can serve as a mask to permit selective metal plating for formation of electrodes, and (c) can serve as an anti-reflection coating. It has been determined that (1) silicon dioxide, (2) a phosphosilicate glass diffusion product as described in U.S. Pat. No. 4,152,824, and (3) a CVD oxide (an oxide produced by a chemical vapor deposition process), are not effective as a dielectric which can serve as a mask to facilitate selected plating without degrading cell performance. However, as determined in the development of this invention, plasma deposited silicon nitride can perform such a role and also offer the advantage that it is a better antireflection coating than the aforementioned oxides or phosphosilicate glass. In this connection it is to be noted that experiments have demonstrated that thermal oxidation of an EFG-grown silicon ribbon after phosphine diffusion resulted in a phosphorous and/or impurity distribution in the ribbon to an extent that it tended to severely degrade cell performance. On the other hand, phosphosilicate glass films tend to have an uncontrollably fast etch rate in an oxide etch solution and are not effective as metal plating masks or as an antireflection coating. CVD oxides such as $TiO_2$ and $SiO_2$ when used solely as plating masks are prone to crazing and cracking.

The invention is based on the discovery that silicon nitride, if applied and utilized in a selected way, can assist in enhancing the performance of shallow junction silicon solar cells and/or facilitating use of other cell fabricating steps, e.g., a step which enhances cell performance or a metallization step which results in formation of an electrode of selected geometry on at least one surface of the silicon substrate.

Referring now to the drawing, the preferred embodiment of the invention relates to the production of solar cells from EFG grown P-type silicon ribbon. As a first process requirement, one side (hereafter the "front side") of a pre-cleaned EFG P-type conductivity silicon ribbon 2 is subjected to a phosphine diffusion calculated to produce a relatively shallow junction 4, i.e., a junction of between about 3000 and about 5000 Angstrom units deep, an N-type conductivity region 6, and a phosphosilicate glass 8. In this preferred embodiment the other side (hereafter the "rear side") of the substrate is not masked off during the diffusion step, with the result that a second junction 4A of substantially like depth, another N-type conductivity region 6A, and a layer of phosphosilicate glass 8A are produced on that side of the substrate. The diffusion is terminated by a furnace cooling step which serves as a gettering treatment that getters impurities at the surface of the ribbon where they can be removed by etching. Preferably the diffusion is carried out at a temperature of between about 800° C. and 1000° C., and the furnace cool gettering treatment involves cooling the ribbon to a temperature of about 650° over a period of between about 1.5 and about 3.0 hours. During the furnace cool gettering treatment the silicon substrate is exposed to an atmosphere of oxygen and nitrogen (in about 1:1 volume ratio) gas.

Next the phosphosilicate glass 8 and 8A is etched away by immersing it in a buffered solution of $10NH_4F(40\%):1HF$ at a temperature of between about 25° C. and about 40° C. In the next step, a thin coating 10 of "polysilazane", a form of silicon nitride, is deposited on the front side of the ribbon by placing the ribbon in a plasma reaction chamber in the presence of gaseous sources of silicon, nitrogen and hydrogen, and subjecting those sources to heat and a suitable voltage so as to produce a polysilazane coating of suitable thickness on the silicon. As used herein, the term "polysilazane" means a form of silicon nitride having a composition represented by the formula $Si_xN_yH_z$, where Si, N and H are silicon, nitrogen and hydrogen respectively and x, y and z each range from about 1.0 to about 1.3. In a particular instance X may equal 1.0 and Y and Z may each range from about 1.0 to about 1.3. This polysilazane (silicon nitride) coating 10 has a relatively rapid etch rate (about 1200 Angstrom units/minute) in a buffered oxide etch such as a solution of HF and $NH_4F$, and is deposited in a relatively thin layer, i.e., between about 500 and about 1500 Angstroms thick. Preferably the silazane is produced in a plasma reaction chamber heated to a temperature of between about 120° C. and 200° C. and subjected to a voltage of between about 450 and 600 volts, and the gaseous sources of silane, nitrogen and hydrogen are silane, nitrogen and ammonia.

The next step involves coating the front side of the ribbon with a negative photoresist 12 in a suitable manner, e.g., by spraying. In the usual case the photoresist is baked to drive off organic solvents in the resist. Typically the baking is achieved by heating the photoresist to between 80° and 100° C. for between about 30 and about 60 minutes.

Then the photoresist is exposed to a suitable radiant energy source through a suitable grid pattern mask so that exposed portions of the resist will polymerize. The electrode grid pattern typically is similar to the multifingered pattern shown in U.S. Pat. No. 3,686,036. Then the resist is developed by contacting it with one or more suitable solutions which serve to remove the unexposed portions of the resist, leaving the exposed portions 12A intact.

Next the silicon nitride layer is subjected to a buffered oxide etch such as a buffered solution of 10NH4(40%):1HF, so as to etch away the nitride in those regions where the resist has been removed and also to clean the rear side of the substrate.

Then the substrate is subjected to infrared heating sufficient to (1) remove the remaining resist by pyrolysis, and (2) convert the polysilazane-type silicon nitride into a form of silicon nitride which is more nearly $Si_3N_4$ and is denser and has a much slower etch rate, typically about 100 or less Angstrom units/minute, than as originally deposited. In this heating step, the substrate is heated to a temperature of about 700° to about 800° C. for about 0.5-2.0 minutes to pyrolyze the resist and convert the polysilazane to the denser form of silicon nitride.

Then the rear side of the substrate is coated with a layer 14 of an aluminum paste. This step is then followed by a second heating step. In the second heating step, the substrate is heated for about 0.5.-2.0 minutes at a temperature of about 576°-620° C. to remove any volatile or pyrolyzable organic components of the paste and to alloy the aluminum in the paste to the silicon substrate.

It is to be noted that the originally deposited polysilazane has a refractive index of about 2.0 and this increases to about 2.1 when it is densified by the first above-described heating step. In the second heating step, the aluminum coating 14 alloys with the back side of the substrate to convert the N-type region 6A to a P+ region 16 having a depth of about 1 to about 3 microns. The P+ region 16 is formed even in the case where the rear side of the substrate does not include an N-type region.

At the end of the second of the foregoing infrared heating steps, the substrate is cleaned by immersing it in water and subjecting it to ultrasonic vibrations to effect removal of excess unalloyed aluminum.

Thereafter both sides of the substrate are plated with nickel, with the nickel layer 18 on the back side being applied over the entire area of the aluminum layer 14 and the nickel layer 20 on the front side being applied over those areas from which the silicon nitride coating has been removed. The nickel does not adhere to the densified silicon nitride coating 10A remaining on the front side of the substrate. Plating of the nickel layers may be done in various ways. Preferably it is accomplished in accordance with a known electroless nickel plating process, e.g., a process of the type described in U.S. Pat. No. 4,321,283 of Kirit Patel et al.

After the nickel has been applied, the substrate is heated in nitrogen or hydrogen to a temperature and for a time sufficient to sinter the nickel layers and cause the nickel layer 20 on the front side of the substrate to react with the adjacent silicon to form a nickel silicide ohmic contact. Preferably the substrate is heated to a temperature of about 300° C. for between about 15 and about 40 minutes. This provides a nickel silicide layer with a depth of about 300 Anstrom units. The nickel layer 18 on the rear side forms an alloy with the aluminum layer. After sintering has been completed, the nickel is subjected to etching with nitric acid to remove excess nickel from both sides of the substrate. The densified silicon nitride film 10A is highly resistant to the nickel etch solution and thus serves as a mask to protect the underlying silicon which excess nickel is etched away.

Thereafter the nickel silicide and nickel/aluminum alloys are further metallized to provide suitable contacts. Preferably but not necessarily, this further metallization involves application of a second layer of nickel to the nickel layers on both sides of the substrate according to one of the methods known in the art. Immediately thereafter, one or more layers of copper are applied to the exposed nickel on both sides of the substrate so as to bond to the nickel layers and thereby protect them against oxidation. The copper may be applied by electrolytic plating. Thereafter the device may be subjected to other known treatments for known purposes, e.g., a layer of tin and solder may be applied successively over the previously applied metal layers.

The aluminum paste 14 preferably comprises aluminum powder in a volatile organic vehicle such as terpineol which can be removed by evaporation. Although the coating of aluminum paint is relatively thin, a substantial portion of the aluminum powder is not alloyed but instead remains as a relatively frangible layer after the second infrared heating step. This excess unalloyed aluminum is removed preferably by ultrasonic cleaning in water.

The nickel etch not only removes excess nickel but also removes some of the nickel aluminum alloy formed on the rear side of the substrate during the sintering step. After the nickel etch step, the front side of the substrate is characterized by a nickel silicide along the entire expanse of the preselected electrode grid pattern, and an aluminum/nickel alloy layer overlying an aluminum electrode layer on the rear side of the substrate.

The silicon nitride remaining on the front side of the substrate serves as an effective anti-reflection coating.

Following is a specific example of the preferred mode of practicing the invention.

EXAMPLE

A silicon ribbon of P-type conductivity made by the EFG process and having a conductivity of about 56 ohm-cm. is cleaned by etching it in a solution of HNO3:HF (1:1) for about 3 minutes at a temperature of about 25° C. Thereafter the ribbon is placed in a diffusion furnace exposed to a continuous flow of an atmosphere comprising oxygen, nitrogen and phosphine (PH3) at a temperature of about 900° C. for a period of approximately 30 minutes. Thereafter the flow of phosphine is terminated and the furnace is allowed to cool in an air (oxygen and nitrogen) atmosphere to a temperature of about 650° C. over a period of about 1.5 hours, after which it is removed from the furnace.

In the diffusion furnace, the following reactions occur:

$$Si(s) + O_2(g) \rightarrow SiO_2(s)$$

$$2PH_3(g) + 4O_2(g) \rightarrow P_2O_5(g) + 3H_2O(g)$$

$$P_2O_5(g) + SiO_2(s) \rightarrow (P_2O_5)_x(SiO_2)_y(s)$$

$$2P_2O_5(s) + 5Si(s) \rightarrow 4P(s) + 5SiO_2(s)$$

where (g) and (s) indicate gaseous and solid states respectively.

The $(P_2O_5)_x(Si)_2)_y$, a phosphosilicate glass, is removed from both sides of the ribbon by submerging the latter in a buffered HF acid solution, e.g., 10NH4F(40%):1HF, for a period of about 2 minutes.

Thereafter the ribbon is placed in a plasma reaction chamber and its front side is exposed for a period of between 3 to 4 minutes to a mixture of nitrogen, ammonia and silane gases which are passed through the reaction chamber and subjected to an applied voltage of 500 volts dc, with the result that the reactive species of those gases react to form a polysilazane which is represented by the formula $Si_xN_yH_z$, where x, y and z each are about 1.0 to 1.3. On removal from the chamber the front side of the ribbon has a polysilazane type silicon nitride coating of about 1000 Angstrom units, which coating has a relatively rapid etch rate of about 1000 Angstroms per minute when immersed in a buffered HF etching solution. The polysilazane coating also has a relatively low density.

Thereafter a layer of a negative photoresist is applied to the front side of the ribbon. A preferred negative resist is marketed under the name of Dynachem. The photoresist is prebaked for about 40-60 minutes at a temperature of 85°-90° C. so as to cause it to adhere firmly to the silicon. This photoresist layer is then covered with a mask in the pattern of a multi-fingered grid electrode, e.g., an electrode having the form illustrated in U.S. Pat. No. 3,686,036. The grid mask is then irradiated with ultraviolet light for approximately 5 to 7 seconds so as to cause the illuminated portion of the photo-resist coating to polymerize. The photoresist is then developed by contact with toluene and propanol or other suitable chemicals. This development process removes those portions of the resist which have not been irradiated and hence have not polymerized.

After development of the resist, the ribbon is subjected to a buffered oxide etch consisting of a solution of HF and $NH_4F$. The etchant etches away the nitride on those portions of the front surface of the ribbon from which the resist has been removed. The ribbon is maintained in the etchant for 1-3 minutes, which is sufficient since the silicon nitride has an etch rate of approximately 1200 Angstroms per minute.

Thereafter the silicon ribbon is passed through an infrared heated zone at a temperature of about 750° C. for about 1.5 minutes, which is sufficient to pyrolize the remaining photoresist on the front side of the ribbon and convert the polysilazane by removal of hydrogen into a substance which (a) is more nearly $Si_3N_4$ and (b) has an etch rate of only about 20-70 Angstrom units per minute in a buffered oxide etch. The silicon nitride coating after infrared heating is relatively dense in comparison to the original polysilazane coating. The exact composition is not known. However, it is known to still contain some hydrogen. Also the densification process causes the layer to shrink in thickness by approximately 10% and to undergo an increase in its refractive index.

After removal from the infrared heating zone the back side of the ribbon is coated with an aluminum paste consisting of minute aluminum particles in a volatile organic vehicle comprising terpineol. The paste is applied as a relatively thin layer. Then the substrate is subjected to infra-red heating at a temperature of about 600° C. for about 1.0 minute to remove the organic component of the aluminum paste and alloy the remaining aluminum to the silicon. During this alloying step the N-type region at the rear side of the ribbon is converted to a P+ region.

After removal from the infra-red heating zone, the silicon ribbon is subjected to ultrasonic cleaning in water for about 1-3 minutes so as to remove any unalloyed aluminum. On removal from the ultrasonic cleaning bath the silicon ribbon has an adherent aluminum layer with a thickness of about 1-3 microns in contact with a P+ region as shown at 16 in the drawings.

Thereafter both sides of the silicon ribbon are coated with a layer of nickel in accordance with the method described in said U.S. Pat. No. 4,321,283. More specifically, both sides of the silicon ribbon are coated with a layer of nickel by immersing the ribbon in an aqueous bath of nickel chloride and ammonium fluoride at a pH of about 2.9 and approximately room temperature for about 2-4 minutes; thereafter the ribbon is subjected to sintering in a furnace at a temperature of about 300° C. in a nitrogen atmosphere for a period of about 25 minutes, whereby nickel on the front side of the ribbon reacts with the adjacent exposed silicon to form a nickel silicide ohmic contact and nickel on the back side forms an alloy with the underlying aluminum layer. It is to be noted that no nickel layer is deposited on the silicon nitride remaining on the first side of the ribbon.

The ribbon is then immersed in an etching solution consisting of $HNO_3$ and kept there for a period of approximately 1-2 minutes so as to remove excess nickel from both sides of the ribbon. On removal from this bath the nickel on the front side of the ribbon is essentially in the form of a nickel silicide.

After removal from the nickel etchant the ribbon is again subjected to ultrasonic cleaning in water to remove all residues. Then a second nickel plating composition is applied to the metallized portions of both sides of the ribbon according to the method described above for the initial nickel plating.

As soon as possible after the second nickel plating step has been completed, a layer of electroless copper is applied to the metallized portions of the two sides of the ribbon. This is followed by a second layer of electrolytically deposited copper applied to the metallized portions of both sides of the ribbon. Electrolytic plating involves a current of 15 amperes and a plating period of 15 minutes. Then a layer of tin is electrolytically deposited onto each copper layer by immersing the ribbon in an electrolytic tin bath for 10 minutes under a current of 10 amps.

Thereafter the finished cell is dipped in a solder bath comprising 62% tin, 36% lead and 2% silver so as to apply a solder layer over the tin coatings.

It has been determined that solar cells made according to the foregoing example from EFG grown ribbons routinely exhibit conversion efficiencies of 10-13%. The silicon nitride remaining on the front side of the finished devices serves as an effective anti-reflection coating. In this connection it is to be noted, as previously mentioned, that the silicon nitride coating does not crack during its thermal treatment or the thermal treatment involved in the aluminum alloying step.

It also has been determined that the above-described phosphine diffusion followed by furnace cool gettering treatment tends to preserve values of lifetime-dependent parameters ($V_{OC}$ and $J_{SC}$) which are necessary for conversion efficiencies in the 10%-13% range.

As previously noted, in order to combine the advantages of (1) a high performance junction formation technique involving phosphine diffusion so as to create a shallow junction plus a furnace cool for gettering purposes, and (2) a low cost-metallization technique, a dielectric is required which can serve as a mask to provide selective plating without degrading cell performance. The plasma-deposited silicon nitride meets that requirement and also offers the added advantage that it is a very effective antireflection coating. Additionally because the undensified polysilazane coating has a fast etch rate and hence need be exposed to etching for only a short time, there is little or no chance of the photoresist being lifted by the etchant with a consequent loss of precision over the etching of the grid electrode pattern in the polysilazane coating.

A further advantage of the silicon nitride deposition and thermal treatment process described above is that the plated metals are not covered by the antireflection coating as in other solar cell fabrication processes. It is to be noted also that the silicon nitride coating is deposited rather than formed by conversion of the heavily doped, i.e., high conductivity, N+ silicon as occurs, for example, when an anti-reflection coating is formed by chemical staining which converts silicon to an oxide fluoride stain A/R coating or when a silicon nitride anti-reflection coating is formed by thermal nitridation (see U.S. Pat. No. 4,266,985 for formation of direct thermal nitride films).

There also appears to be evidence that the thermal treatment of the silicon nitride during the aluminum alloying step results in performance enhancement of the solar cell product by lowering the surface recombination velocity.

Of course, the process provided by this invention is not limited to the production of solar cells from EFG substrates. Thus, for example, silicon substrates derived from CZ grown boules or grown from the melt by other methods also may be used to form relatively high efficiency solar cells according to the present invention. Also the invention may be applied to silicon substrates which are not ribbons and are not flat, e.g., circular pieces of silicon or silicon in forms having an arcuate or polygonal cross-sectional shape.

The silicon nitride process steps herein described may be used in the manufacture of other kinds of semiconductor devices. Also the silicon nitride heat treatment may be conducted without simultaneous pyrolysis of the resist, since the latter may be removed by chemical means immediately after the polysilazane coating has been etched in the form of a selected grid electrode pattern and before the thermal treatment of the polysilazane coating. Additionally the substrate may be tested for conductivity and resistivity immediately after the phosphorus silicate glass has been etched or, if the resist is removed after the polysilazane coating has been etched, immediately after the resist has been stripped but before an aluminum plating has ocurred.

A further modification involves applying the aluminum paste to the back side of the substrate after the initial silicon nitride coating has been etched but before it has been densified by heating, and then using a single heating step to simultaneously (a) pyrolyze residual resist, (b) evaporate the liquid paste vehicle so as to dry the coating of aluminum, (c) alloy the aluminum and silicon, and (d) modify the polysilazone coating to a denser form of silicon nitride having a lower etch rate. The foregoing may be achieved by heating the substrate after application of the aluminum paste to a temperature of between about 700° and 850° C., preferably between about 805° and about 825° C., for a period of about 2-6 minutes. In this modification, the substrate is ultrasonically cleaned as described above after the single heating step is completed, after which the nickel plating and subsequent metallization steps may be carried out as herein described. A further obvious modification is to mask the rear side of the substrate during the diffusion junction formation step, so as to prevent formation of back junction 4A and the N-type region 6A. In such case a P+ region as shown at 16 is still produced when the aluminum layer 14 is alloyed to the silicon substrate.

Still other changes may be made without departing from the principles of the invention as, for example, forming the P+ back region of the cell by using flame sprayed aluminum instead of an aluminum paint or using different methods of applying the second and subsequent coatings of nickel and/or coating(s) of copper, or forming the junction by ion implantation.

As used in the following claims, the term "polysilazane", means a silicon nitride composition which (a) is represented by the formula $Si_xN_yH_z$ where x, y and z are each between about 1.0 and about 1.3, (b) has an etch rate in a buffered oxide etch solution of HF and $NH_4F$ that is at least about 10 times faster than the etch rate of the densified silicon nitride coating in the same etch solution, and (c) is convertible by heating to a denser form of silicon nitride.

What is claimed is:
1. Method of fabricating solid state semiconductor devices comprising:
 (a) providing a silicon substrate having first and second opposite surfaces;
 (b) forming a PN junction in said substrate adjacent said first surface;
 (c) forming on said first surface a polysilazane coating having a relatively fast etch rate relative to a selected etchant;
 (d) covering said polysilazane coating with an adherent coating of a photoresist material;
 (e) exposing said photoresist coating to radiant energy through a mask defining a predetermined two-dimensional pattern;
 (f) chemically developing said photoresist so that selected portions of said resist are removed from said polysilazane coating according to said predetermined pattern;
 (g) removing those portions of said polysilazane coating which are not covered by said photoresist so that selected portions of said first surface are exposed to the atmosphere;
 (h) heating said silicon substrate at a temperature and for a time sufficient to (1) effect removal of said photoresist material by pyrolysis and (2) modify said polysilazane coating so that it has a relatively low etch rate relative to said selected etchant;
 (j) applying a coating of aluminum to said second opposite surface;
 (k) heating said silicon substrate to a temperature and for a time sufficient to cause the aluminum constituent of said aluminum coating to alloy with said silicon ribbon;
 (l) applying a nickel coating to said selected portions of said first surface;
 (m) sintering said nickel coating so that the nickel and silicon react to form a nickel silicide at their interface;
 (n) contacting said nickel coating with an etchant to remove unbonded nickel; and
 (o) over-coating said nickel coating with copper.

2. Method according to claim 1 wherein said substrate is P-type silicon and said junction is formed by diffusing phosphorus into said first side surface to a depth of about 3000 to about 4000 Angstrom units at a temperature of between about 800° C. and about 1000° C., and the diffusion is terminated by cooling the substrate to a temperature of about 650° C. over a period of between about 1.5 and about 3.0 hours in an atmosphere comprising oxygen and nitrogen gas.

3. Method according to claim 1 wherein said polysilazane coating is formed with a thickness of between about 500 and about 1500 Angstrom units thick.

4. Method according to claim 3 wherein said polysilazane coating is formed by placing the substrate in a plasma reaction chamber in the presence of gaseous sources of silicon, nitrogen and hydrogen and subjecting those gaseous sources at a temperature of between about 120° C. and 200° C. to a voltage of between about 450 and 600 volts.

5. Method according to claim 4 said polysilazane coating is represented by the formula $Si_xN_yH_z$ where x=1 and y and z each range from about 1.0 to about 1.3.

6. Method according to claim 5 wherein during the first-mentioned heating step said first coating is converted to a composition which contains hydrogen but is more nearly $Si_3N_4$.

7. Method according to claim 5 wherein prior to said first heating step said first coating has an etch rate in said selected etchant at least ten times greater than its etch rate after said heating.

8. Method according to claim 7 wherein the substrate is heated by infrared heating means.

9. Method according to claim 1 wherein the aluminum coating is formed by coating portions of the substrate with an aluminum paste comprising particles of aluminum in a volatile liquid vehicle.

10. A method according to claim 1 wherein the substrate is P-type silicon, said PN junction is formed by a diffusion process which produces an N-type conductivity region at said second surface, and said N-type conductivity region is converted to a P+ type region when said aluminum coating is alloyed with said substrate.

11. A method according to claim 1 wherein said substrate is in the form of a substantially flat ribbon.

12. Method of making a solar cell using a silicon substrate having first and second opposite side surfaces comprising the following steps:
(1) forming a shallow PN junction adjacent said first side surface of said substrate;
(2) forming on said first side surface a first coating which is characterized by a relatively high etch rate relative to a selected etchant and has the composition $Si_xN_yH_z$ where x, y and z each have a value of between about 1.0 and 1.3;
(3) covering said first coating with a second, thermally-degradable etch-resistant coating which defines an electrode pattern characterized by a plurality of finger-like elements;
(4) removing those portions of said first coating which are not covered by said second coating so that selected portions of said first surface are exposed to the surrounding atmosphere;
(5) coating said second side surface with aluminum;
(6) heating said substrate so as to (a) pyrolytically remove said second, thermally degradable coating, (b) alloy the aluminum with said substrate, and (c) modify said first coating so that it has a composition more nearly the same as a coating having the composition $Si_3N_4$ and is characterized by a relatively low etch rate relative to said selected etchant; and
(7) applying a nickel coating to said first and second surfaces.

13. Method according to claim 12 wherein said substrate is P-type silicon and said junction is formed by diffusing phosphorus into said first side surface to a depth of about 3000 to about 4000 Angstrom units at a temperature of between about 800° C. and about 1000° C., and the diffusion is terminated by cooling the substrate to a temperature of about 650° C. over a period of between about 1.5 and about 3.0 hours in an atmosphere comprising oxygen and nitrogen gas.

14. Method according to claim 12 wherein said first coating is formed with a thickness of between about 500 and 1500 Angstrom units thick.

15. Method according to claim 12 wherein said first coating is formed by placing the substrate in a plasma reaction chamber in the presence of gaseous sources of silicon, nitrogen and hydrogen and subjecting those gaseous sources at a temperature of between about 120° C. and 200° C. to a voltage of between about 450 and 600 volts.

16. Method according to claim 12 wherein said first coating is represented by the formula $Si_xN_yH_z$ where X=1 and y and z each range from about 1.0 to about 1.3.

17. Method according to claim 12 wherein prior to said heating step said first coating has an etch rate in said selected etchant at least ten times greater than its etch rate after said heating.

18. Method according to claim 12 wherein the substrate is heated by infrared heating means.

19. Method according to claim 12 wherein the aluminum coating is formed by coating portions of the substrate with an aluminum paste comprising particles of aluminum in a volatile liquid vehicle.

20. Method of fabricating solid state semiconductor devices comprising:
(a) providing a silicon substrate having first and second opposite surfaces;
(b) forming a PN junction in said substrate adjacent said first surface;
(c) forming on said first surface a polysilazane coating;
(d) covering said polysilazane coating with an adherent coating of a photoresist material;
(e) treating said photoresist so that portions of said resist are removed from selected portions of said polysilazane coating so as to define a predetermined two-dimensional electrode pattern;
(f) removing those portions of said polysilazane coating which are not covered by said photoresist so that selected portions of said first surface are exposed to the atmosphere;
(g) accomplishing in selected order (a) the removal of residual resist, (b) the formation of an aluminum layer on said second opposite surface which is alloyed with said silicon substrate, and (c) the conversion of said polysilazane coating to a composition of silicon and nitrogen having a relatively low etch rate relative to said selected etchant;
(h) applying a nickel coating to said selected portions of said first surface;
(i) sintering said nickel coating so that the nickel and silicon react to form a nickel silicide at their interface;
(j) contacting said nickel coating with an etchant to remove unbonded nickel; and
(k) over-coating said nickel coating with copper.

21. Method of fabricating solid state semiconductor devices comprising:
(a) providing a silicon substrate having at least first and second opposite surfaces;

(b) forming a PN junction in said substrate adjacent said first surface;
(c) forming on said first surface a coating of an inorganic compound comprising silicon, nitrogen and hydrogen having a relatively fast etch rate relative to a selected etchant;
(d) covering said inorganic compound coating with an adherent coating of a photoresist material;
(e) treating said photoresist coating so that portions of said resist are removed from selected portions of said inorganic compound coating according to a predetermined two-dimensional pattern;
(f) removing those portions of said inorganic compound coating which are not covered by said photoresist so that selected portions of said first surface are exposed to the atmosphere; and
(g) accomplishing in selected order (a) the removal of residual resist, and (b) the conversion of said inorganic compound coating so that it is densified and has a relatively low etch rate relative to said selected etchant.

22. Method according to claim 21 wherein removal of residual resist and the conversion of said inorganic compound coating is accomplished by heating said coating to a selected temperature.

23. Method according to claim 21 further including the steps of:
(a) applying a metal coating to said selected portions of said first surface; and
(b) treating said metal coating so that the metal and silicon react to form an ohmic interface.

* * * * *